United States Patent
Terashima et al.

(10) Patent No.: US 8,685,163 B2
(45) Date of Patent: Apr. 1, 2014

(54) METHOD FOR GROWING SILICON CARBIDE SINGLE CRYSTAL

(75) Inventors: Yukio Terashima, Mishima (JP); Yasuyuki Fujiwara, Shizuoka (JP)

(73) Assignee: Toyota Jidosha Kabushiki Kaisha, Toyota-shi, Aichi-ken (JP)

( * ) Notice: Subject to any disclaimer, the term of this patent is extended or adjusted under 35 U.S.C. 154(b) by 632 days.

(21) Appl. No.: 12/599,520

(22) PCT Filed: Nov. 18, 2008

(86) PCT No.: PCT/JP2008/071277
§ 371 (c)(1), (2), (4) Date: Nov. 10, 2009

(87) PCT Pub. No.: WO2009/069564
PCT Pub. Date: Jun. 4, 2009

(65) Prior Publication Data
US 2010/0236472 A1  Sep. 23, 2010

(30) Foreign Application Priority Data
Nov. 27, 2007  (JP) .................................. 2007-306367

(51) Int. Cl.
*C30B 19/02* (2006.01)

(52) U.S. Cl.
USPC .................... 117/54; 117/11; 117/64; 117/65; 117/67; 117/73; 117/78; 117/951

(58) Field of Classification Search
USPC ................. 117/11, 54, 64, 65, 67, 73, 78, 951
See application file for complete search history.

(56) References Cited

FOREIGN PATENT DOCUMENTS

| JP | 2000-264790 | 9/2000 |
|---|---|---|
| JP | 2004-002173 | 1/2004 |
| JP | 2006-143555 | 6/2006 |
| JP | 2006-321681 | 11/2006 |
| JP | 2007-76986 | 3/2007 |
| JP | 2007-261844 | 10/2007 |
| WO | WO 2006/070749 A1 | 7/2006 |

OTHER PUBLICATIONS

Japanese Patent Office, English Computer Translation of JP 2000-264790 (2012).*

* cited by examiner

*Primary Examiner* — Matthew Song
(74) *Attorney, Agent, or Firm* — Finnegan, Henderson, Farabow, Garrett & Dunner, LLP

(57) ABSTRACT

A method for growing a silicon carbide single crystal on a single crystal substrate comprising the steps of heating silicon in a graphite crucible to form a melt, bringing a silicon carbide single crystal substrate into contact with the melt, and depositing and growing a silicon carbide single crystal from the melt, wherein the melt comprises 30 to 70 percent by atom, based on the total atoms of the melt, of chromium and 1 to 25 percent by atom, based on the total atoms of the melt, of X, where X is at least one selected from the group consisting of nickel and cobalt, and carbon. It is possible to improve morphology of a surface of the crystal growth layer obtained by a solution method.

7 Claims, 2 Drawing Sheets

ND FOR GROWING SILICON
METHOD FOR GROWING SILICON CARBIDE SINGLE CRYSTAL

CROSS-REFERENCE TO RELATED APPLICATIONS

This application is a national phase application of International Application No. PCT/JP2008/071277, filed Nov. 18, 2008, and claims the priority of Japanese Application No. 2007-306367, filed Nov. 27, 2007, the contents of both of which are incorporated herein by reference.

FIELD OF INVENTION

The present invention relates to a new method for growing a silicon carbide single crystal by a solution method, more particularly to a method for growing a silicon carbide single crystal by a solution method using a new melt (sometimes referred to as a solution), that is subjected to improve morphology of a crystal growth surface and increase a crystal growth rate.

BACKGROUND OF INVENTION

A silicon carbide (SiC) single crystal has superior properties such as thermal and chemical stability, excellent mechanical strength, good resistance to radiation, and dielectric breakdown voltage and thermal conductivity higher than Si. It is also characterized in that it is easy to electronically control p and n conductivity types by doping an impurity, as well as it has a wide band gap (about 3.0 eV for single crystal 6H—SiC, about 3.3 eV for single crystal 4H—SiC). Therefore, it can achieve high temperature, high frequency, resistance to voltage and resistance to environment, which cannot be achieved by any existing semiconductor material, such as silicon (Si) and gallium arsenide (GaAs). It is increasingly expected as a next-generation semiconductor material.

Heretofore, a vapor phase method, Acheson method, and a solution method are known as typical methods for growing a silicon carbide single crystal.

Typical examples of vapor phase methods include a sublimation method and a chemical vapor deposition (CVD) method. In a sublimation method, various defects tend to be formed in a crystal and a crystal tends to be poly-crystallized. In a CVD method, because raw materials are limited to gases, a formed crystal is a thin film and therefore it is difficult to produce a bulk single crystal.

Furthermore, in Acheson method, since silica stone and coke are used as raw materials and heated in an electric furnace, it is impossible to obtain a high-purity product because of impurities contained in the raw materials.

And, the solution method is a method that comprises melting silicon-containing alloy in a graphite crucible, dissolving carbon from the graphite crucible into the melt, growing silicon carbide crystal layer on a seed crystal substrate placed at the cold area by solution deposition. And, it is known that the solution method has low growth rate but it is advantageous as a method to obtain a bulk crystal.

For this reason, recently, various studies have been done to enhance a growth rate for growing a silicon carbide single crystal by a solution method that has not above-mentioned problems in a vapor phase method and Acheson method.

Japanese Unexamined Patent Publication No. 2000-264790 describes a method for producing a silicon carbide single crystal, wherein the method comprises melting a raw material containing at least one element of transition metals, Si, and carbon to form a melt, bringing the melt into contact with a silicon carbide seed crystal as well as cooling the melt to the temperature lower than the liquidus-line temperature of the melt, depositing and growing the silicon carbide single crystal. And, although it discloses Fe, Co, Ni (group VIII), Ti, Zr, Hf (group IVb), V, Nb, Ta (group Vb), Cr, Mo and W (group VIb) as transition metals, it discloses only a composition comprising Mo, Cr, and Co. However, with respect to the quality of a depositing single crystal, a measuring method or identifying means is not disclosed, and a macro defect of the crystal growth surface is not recognized.

Japanese Unexamined Patent Publication No. 2004-2173 describes a method for producing a silicon carbide single crystal, comprising the steps of immersing a seed crystal substrate of silicon carbide into an alloy melt that contains Si, C and M, where M is Mn or Ti, has M/(Si+M) atomic ratio (X) of 0.1 to 0.7 when M is Mn and 0.1 to 0.25 when M is Ti, and does not contain unmelted C, and growing a silicon carbide single crystal on the seed crystal substrate by putting silicon carbide into super-saturation state by super-cooling the alloy melt in the periphery of the seed crystal substrate. In addition, it described that silicon carbide tends to be poly-crystallized by carbon that was charged as a raw material, concerning the method for producing a silicon carbide single crystal described in Japanese Unexamined Patent Publication No. 2000-264790.

Japanese Unexamined Patent Publication No. 2006-143555 describes a method for producing a silicon carbide single crystal, wherein the method comprises immersing a seed crystal substrate of silicon carbide into a alloy melt that contains Si, C and M, where M is Fe or Co, and has the value of [M]/([M]+[Si]), wherein [M] expresses molar concentration of M; [Si] expresses molar concentration of Si, not less than 0.2 and not more than 0.7 when M is Fe, or not less than 0.05 and not more than 0.25 when M is Co, growing a silicon carbide single crystal on the seed crystal substrate by putting the alloy melt in the periphery of the seed crystal substrate into super-saturation state of silicon carbide. However, a macro defect of the crystal growth surface is not recognized.

Japanese Unexamined Patent Publication No. 2007-76986 describes a method for producing a silicon carbide single crystal, wherein the method comprises bringing a single crystal substrate for growing silicon carbide contact with a melt that contains Si, Ti, M and C, where M is Co and/or Mn and has the following atomic ratio of Si, Ti and M: $0.17 \leq [Ti]/[Si] \leq 0.33$ and $0.90 \leq ([Ti]+[M])/[Si] \leq 1.80$, where [Ti] expresses molar concentration of Ti, [M] expresses molar concentration of M, or that contains Si, Ti, M and C, where M is Al, and has the following atomic ratio of Si, Ti and M, wherein, $0.17 \leq [Ti]/[Si] \leq 0.33$ and $0.33 \leq ([Ti]+[M])/[Si] \leq 0.6$, where [Ti] expresses molar concentration of Ti, [Si] expresses molar concentration of Si, [M] expresses molar concentration of M, growing a silicon carbide single crystal on the single crystal substrate by putting the silicon carbide dissolved in the melt into super-saturation state by super-cooling the melt in the periphery of the single crystal substrate. However, the macro defect of a grown crystal surface is not recognized.

SUMMARY OF INVENTION

As mentioned above, in the methods for growing a silicon carbide single crystal by the solution method described in the heretofore known literature, the macro defect of a grown crystal surface was not recognized, and it was impossible to improve morphology of a surface of the crystal growth layer.

As a result of study about the method for growing a silicon carbide single crystal by a solution method, we have found that a relatively large growth rate is obtained by using a Si—Cr—C melt comprising not less than certain amount of Cr, but, that the surface of the silicon carbide single crystal growth layer obtained is unstable when Si—Cr—C melt is used, that small variation of growing conditions negatively impact the surface of the growth layer, in other words, that morphology (configuration) of a surface of grown crystal is not sufficient, and therefore it may affect the quality of grown crystal obtained.

The object of the present invention is to provide a method for growing a silicon carbide single crystal by a solution method to improve morphology of a surface of a crystal growth layer.

The present invention relates to a method for growing a silicon carbide single crystal on a single crystal substrate comprising the steps of heating silicon in a graphite crucible to form a melt, bringing a silicon carbide single crystal substrate into contact with the melt, and depositing and growing a silicon carbide single crystal from the melt, wherein the melt comprises 30 to 70 percent by atom, based on the total atoms of the melt, of chromium and 1 to 25 percent by atom, based on the total atoms of the melt, of X, where X is at least one selected from the group consisting of nickel and cobalt, and carbon.

According to the present invention, it is possible to achieve the improvement of morphology of the surface of a crystal growth layer and to grow a silicon carbide single crystal at a growth rate that is the same as or higher than the solution method described in the heretofore known literature.

DESCRIPTION OF EMBODIMENTS

Figure 1:
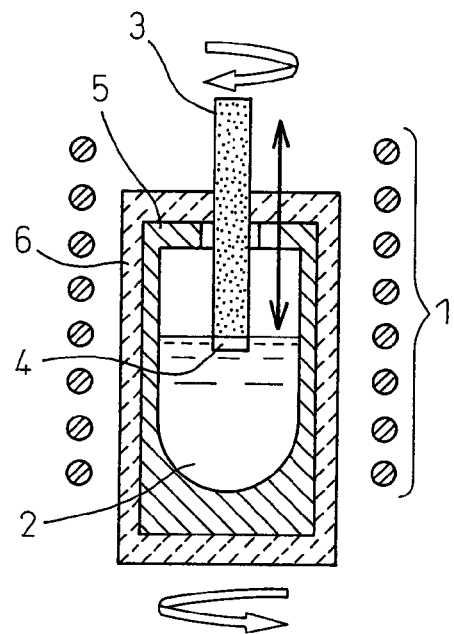
FIG. 1 depicts an embodiment of a production equipment to carry out the method of the present invention.

The present invention is illustrated referring to FIG. 1 that depicts an embodiment of a production equipment to carry out the method of the present invention.

In FIG. 1, the growth of silicon carbide single crystal is carried out using graphite crucible 5 surrounded with heat insulator 6 as a reaction vessel. The growth of a silicon carbide single crystal can be achieved by bonding and fixing single crystal substrate 4 comprising silicon carbide single crystal on the tip of graphite bar 3 (also referred to as graphite axis) that is an example of silicon carbide seed crystal supporting member, and dipping this into melt 2, wherein melt 2 is heated by high frequency coil 1 as a heating equipment, growing a single crystal substrate 4.

In the present invention, it is necessary in the method for growing a silicon carbide single crystal on a single crystal substrate comprising the steps of heating silicon in a graphite crucible to form a melt, bringing a silicon carbide single crystal substrate into contact with the melt, and depositing and growing a silicon carbide single crystal from the melt, that the melt comprises 30 to 70 percent by atom, based on the total atoms of the melt, of chromium and 1 to 25 percent by atom, based on the total atoms of the melt, of X, where X is at least one selected from the group consisting of nickel and cobalt, and carbon.

Without use of both Cr and X, for example, three elements Mo—Si—C, three elements Cr—Si—C, three elements Co—Si—C that are described as concrete examples in Japanese Unexamined Patent Publication No. 2000-264790, are expected to improve growth rate, but may provide poor quality of depositing crystal.

Furthermore, in the Si—Cr—X—C melt, growth rate of the silicon carbide single crystal will be particularly low when Cr is less than 30 percent by atom, polycrystal forms around the silicon carbide single crystal and it comes to be very difficult to grow only a single crystal stably when Cr is more than 70 percent by atom. Therefore, these cases are not proper. Furthermore, in the Si—Cr—X—C melt, morphology of surface of a silicon carbide single crystal is not improved when X is lower than 1 percent by atom, part or all of the silicon carbide crystal obtained poly-crystallizes when X is more than 25 percent by atom, and then it turns difficult to grow a single crystal stably, so these cases are not preferable.

In the present invention, the reason why the growth rate of silicon carbide single crystal is increased and morphology of crystal surface is improved by using the Si—Cr—X—C melt of said composition is believed that Cr improves dissolution of C (carbon) from the graphite (crucible in FIG. 1) with which the melt liquid contacts, this C will become a raw material of silicon carbide crystal as a result, and X will reduce energy of solid-liquid interface or surface energy of melt (solution).

There are no restrictions on a method for preparing the Si—Cr—X—C melt having the aforementioned composition and for obtaining a silicon carbide single crystal in the method of the present invention. For example, first Si, Cr and X are added as raw materials in a graphite crucible in a reaction vessel, the raw materials are melted and heated to the temperature higher than the solidus temperature of the produced alloy to form a melt. In addition, at least part of C in the Si—Cr—X—C melt originates from the graphite crucible, and it is especially preferable that all of C originates from the graphite crucible. Furthermore, part of C may be charged as a raw material that is carbide or carbon. And part of C may be supplied to the melt by blowing a gas containing carbon, such as methane, into the melt.

Heating of the melt is continued. Raw materials consisting of Si, Cr and X are melted sufficiently and C is sufficiently dissolved. Carbon concentration in the melt generated comes to near the saturating concentration of silicon carbide in the melt as a solvent. When the carbon concentration becomes constant, a seed crystal substrate for silicon carbide growth is brought to contact with the melt. A silicon carbide single crystal grows on the single crystal substrate by putting silicon carbide melted in the melt into super-saturation state by super-cooling the melt in the periphery of the seed crystal substrate to the temperature not higher than 2100° C., especially approximately 1600 to 1800° C. with the use of temperature gradient method in which the melt has temperature gradient of, for example, approximately 5 to 50° C./cm or with the use of cooling process that cools the melt by operating the heating equipment.

It is preferable to use a single crystal seed having the same crystalline form as the crystal to be grown. For example, a single crystal of silicon carbide made by sublimation method can be used.

In the method of the present invention, manufacturing procedure that is heretofore known in itself in the solution method, for example, graphite crucible shape, heat method, heating time, atmosphere, rate of temperature increase and rate of cooling, can be applied.

For example, heat method may include high-frequency induction heating. Heating time (approximate time from charging of the raw material before SiC saturating concentration is reached) may include approximately from a several hours to 10 hours depending on the size of a crucible (for example, approximately from 3 to 7 hours). Atmosphere may include rare gas, inert gas such as He, Ne, Ar, or combination of the above-mentioned gas and $N_2$ or methane.

According to the method of the present invention, it is possible to produce a silicon carbide single crystal, preferably n-type silicon carbide single crystal that does not substantially include polycrystal, with the growth rate that is the same as or higher than the previously known growth method of a silicon carbide single crystal by the solution method of three-components system (for example, Si—Cr—C melt system) or four-components system (for example, Si—Ti—Al—C melt system, Si—Ti—Mn—C melt system, Si—Ti—Co—C melt system).

In addition, according to the method of the present invention, it is possible to produce a silicon carbide single crystal that can achieve the improvement of morphology of a surface of crystal growth layer.

The method of the present invention is of course applicable to the growth method of a bulk single crystal. It is also applicable to the surface of silicon carbide substrate in liquid phase epitaxial growth layer forming technique.

EXAMPLES

The following examples illustrate the present invention.

Figure 2:
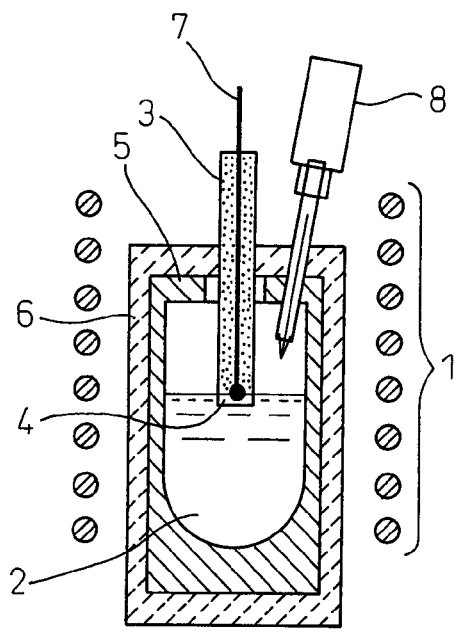
FIG. 2 depicts an equipment by which growth experiment for a silicon carbide single crystal was carried out in each example.

In the following each example, growth experiment of a silicon carbide single crystal was carried out using the equipment in which a graphite crucible depicted in FIG. 2 was used as a reaction vessel. Further, a graphite bar 3 had a W—Re thermocouple in it, and a radiation thermometer 8 was placed at a graphite crucible 5.

To the graphite crucible 5, Si was added, and then Cr and X were added together at the same time. The preset temperature from 1800 to 2100° C. was maintained for 2 to 3 hours by heating continuously. C was dissolved into the melt 2 from graphite crucible 5 to reach the silicon carbide saturating concentration. A silicon carbide single crystal substrate 4 that was fixed on the tip of graphite bar 3 was dipped into the melt 2. After maintaining the preset temperature, a silicon carbide single crystal grew on the single crystal substrate 4 by setting a temperature gradient to the melt of 0.8 to 3.0° C./mm between the single crystal substrate 4 and the front surface of growing crystal (not shown), by operating a high frequency coil 1 that is a heating equipment. After a lapse of growth time, grown crystal was pulled out completely from the melt 2 and the graphite crucible 5 was cooled slowly to room temperature, then grown silicon carbide single crystal was obtained.

Concerning silicon carbide crystal obtained in each example, morphology of a surface of the crystal growth layer was observed by eyes and by microscope. In addition, whether a silicon carbide crystal obtained in each example was a single crystal or polycrystal was confirmed by X-ray (XRD).

Comparative Example 1

A raw material comprising 45 percent by atom of Si and 45 percent by atom of Cr was added in the graphite crucible, heated and melted. After maintaining a constant temperature, crystal growth was carried out by dipping a single crystal substrate into the melt. The silicon carbide crystal obtained was confirmed to be a single crystal.

Measurement of temperature of the melt etc. was carried out using a radiation thermometer and a thermocouple. The radiation thermometer was installed at the observation window above the liquid surface, wherein from the window the liquid surface could be observed directly, it was possible to determine the temperature before and after contact with melt. In addition, the temperature just after contact with the melt was determined by using the thermocouple installed inside the graphite bar, on which a single crystal substrate was attached, at the position of 2 cm apart from the single crystal substrate.

Growth rate of silicon carbide single crystal was 210 µm/h.

Figure 3A:
FIG. 3A shows a picture of morphology of a surface of the crystal growth layer of silicon carbide crystal obtained in comparative example 1, wherein the composition atomic ratio of Si:Cr is 50:50.
Figure 3B:
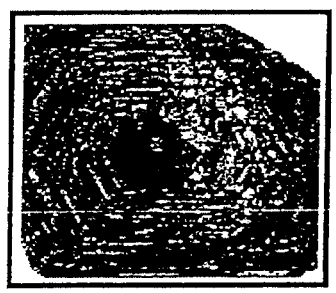
FIG. 3B shows a picture of morphology of a surface of the crystal growth layer of silicon carbide crystal obtained in comparative example 1, wherein the composition atomic ratio of Si:Cr is 60:40.

Furthermore, pictures of morphology of surfaces of crystal growth layer are shown in FIG. 3A and FIG. 3B. FIG. 3A shows a picture in the case that the atomic ratio of Si:Cr is 50:50, FIG. 3B shows a picture in the case that atomic ratio of Si:Cr is 60:40. From FIG. 3A and FIG. 3B, when using a Si—Cr—C melt, morphology of many steps appeared on the growth surface of the silicon carbide single crystal, and it is found that morphology of the surface is poor.

Example 1

A raw material comprising 50 percent by atom of Si and 45 percent by atom of Cr and 5 percent by atom of Ni was added in graphite crucible 5, heated and melted. After maintaining a constant temperature, a crystal growth was carried out by dipping a single crystal substrate into the melt. The silicon carbide crystal obtained was confirmed to be a single crystal.

Measurement of temperature of the solution etc., observation of morphology, measurement of growth rate of silicon carbide single crystal were carried out in the same manner as in Comparative Example 1.

Growth rate of SiC single crystal was 240 µm/h.

Figure 4:
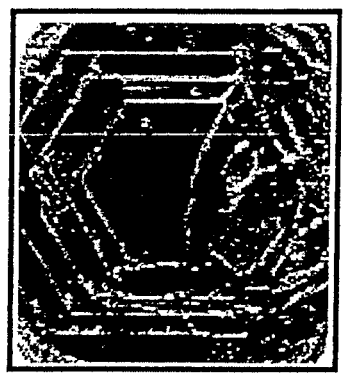
FIG. 4 shows a picture of morphology of a surface of crystal growth layer of silicon carbide crystal obtained in example 1.

Furthermore, a picture of morphology of the surface of a crystal growth layer is shown in FIG. 4. From FIG. 4, when using a Si—Cr—Ni—C melt, morphology of the growth surface of silicon carbide single crystal was found to be significantly improved.

Comparative Example 2

Crystal growth was carried out in the same manner as in Example 1 except that the raw material consisting of Si, Ti and Al, ratio of Al being altered in the range between 0 and 10 percent by atom, was added in the graphite crucible 5, heated and melted, maintained at a constant temperature (about 1810° C.), a single crystal substrate was dipped into the melt.

In the Si—Ti—Al—C melt system, growth rate of crystal was not more than 140 µm/h even though Al ratio of the total composition was altered.

Example 2

A raw material comprising 50 percent by atom of Si and 45 percent by atom of Cr and 5 percent by atom of Co was added in the graphite crucible 5, heated and melted. After maintaining a constant temperature, crystal growth was carried out by dipping a single crystal substrate into the melt. The silicon carbide crystal obtained was found to be a single crystal.

Measurement of temperature of the solution etc., observation of morphology, measurement of growth rate of silicon carbide single crystal were carried out in the same manner as in Comparative Example 1.

Growth rate of silicon carbide single crystal was 225 μm/h.

Furthermore, a picture of morphology of growth surface of a crystal growth layer was same as FIG. 4. From this result, when using a Si—Cr—Co—C melt, morphology of the growth surface of silicon carbide single crystal was found to be significantly improved.

Comparative Example 3

Crystal growth was carried out in the same manner as in Example 1 except that the raw material consists of Si and Cr without adding Ni, ratio of Cr being altered in the range between 3 and 95 percent by atom, was added in the graphite crucible 5, heated and melted, maintained at a constant temperature (about 1980° C.), a single crystal substrate was dipped into the melt.

Morphology of the surface of a silicon carbide crystal growth layer was poor as same as Comparative Example 1, and part or all of silicon carbide obtained was found to be poly-crystallized when ratio of Cr in the total amount of Si and Cr was more than 70 percent by atom.

INDUSTRIAL APPLICABILITY

The method for growing silicon carbide single crystal of the present invention will make it possible to obtain a single crystal of silicon carbide that may have possibility to achieve high temperature, high frequency, resistance to voltage and resistance to environment, therefore has possibility as a next generation semiconductor material.

In addition, the method for growing silicon carbide single crystal of the present invention will make it possible to achieve the improvement of morphology of a surface of silicon carbide grown crystal.

Furthermore, the method for growing silicon carbide single crystal of the present invention will make it possible to grow a silicon carbide single crystal with the growth rate that is same as or higher than the heretofore known solution method.

The invention claimed is:

1. A method for growing a silicon carbide single crystal on a single crystal substrate comprising:
   heating silicon in a graphite crucible to form a melt,
   bringing a silicon carbide single crystal substrate into contact with the melt, and
   depositing and growing a silicon carbide single crystal from the melt,
   wherein the melt is a Si—Cr—X—C melt consisting of
      30 to 70 percent by atom, based on the total atoms of the melt, of chromium,
      1 to 25 percent by atom, based on the total atoms of the melt, of X, where X is at least one selected from the group consisting of nickel and cobalt,
      silicon, and
      carbon.

2. The method according to claim 1, wherein the melt comprises 3 to 7 percent by atom, based on the total atoms of the melt, of X.

3. The method according to claim 1, wherein the melt is prepared by adding Si, Cr and X as raw materials in a graphite crucible, melting the raw materials to form an alloy, and heating the alloy to a temperature higher than a solidus temperature of the alloy.

4. The method according to claim 1, wherein at least part of carbon in the melt originates from the graphite crucible.

5. The method according to claim 1, wherein all of carbon originates from the graphite crucible.

6. The method according to claim 1, wherein the single crystal substrate has the same crystal form as the silicon carbide single crystal to be grown.

7. The method according to claim 1, wherein the method is used for growing a bulk single crystal.

* * * * *